(12) United States Patent
Carreau et al.

(10) Patent No.: US 7,834,793 B2
(45) Date of Patent: Nov. 16, 2010

(54) SELF-TIMED CLOCKED ANALOG TO DIGITAL CONVERTER

(75) Inventors: Gary Carreau, Plaistow, NH (US);
Bruce Amazeen, Ipswich, MA (US)

(73) Assignee: Analog Devices, Inc., Norwood, MA (US)

(*) Notice: Subject to any disclaimer, the term of this patent is extended or adjusted under 35 U.S.C. 154(b) by 27 days.

(21) Appl. No.: 12/324,121

(22) Filed: Nov. 26, 2008

(65) Prior Publication Data
US 2010/0127908 A1    May 27, 2010

(51) Int. Cl.
*H03M 1/12* (2006.01)
(52) U.S. Cl. .......................... 341/155; 363/20; 363/129; 323/222; 365/193
(58) Field of Classification Search ......... 341/130–170; 363/20, 129, 279; 365/193, 205, 222, 236; 323/222, 282
See application file for complete search history.

(56) References Cited

U.S. PATENT DOCUMENTS

| | | | | |
|---|---|---|---|---|
| 5,027,116 | A * | 6/1991 | Armstrong et al. | 341/155 |
| 6,400,302 | B1 * | 6/2002 | Amazeen et al. | 341/172 |
| 7,167,121 | B2 * | 1/2007 | Carreau et al. | 341/150 |
| 7,400,118 | B1 * | 7/2008 | Zhang et al. | 323/222 |
| 2008/0100490 | A1 | 5/2008 | Chatal et al. | |
| 2009/0102780 | A1 * | 4/2009 | Brown | 345/101 |
| 2009/0273739 | A1 * | 11/2009 | Brown | 349/72 |

OTHER PUBLICATIONS

Shuo-Wei Michael Chen and Robert W. Brodersen, "A 6-bit 600-MS/s 5.3-mW Asynchronous ADC in 0.13- m CMOS", IEEE Journal of Solid-State Circuits, vol. 41, No. 12, Dec. 2006, pp. 2669-2680.
Brian P. Ginsburg and Anantha P. Chandrakasan, "Dual Time-Interleaved Successive Approximation Register ADCs for an Ultra-Wideband Receiver", IEEE Journal of Solid-State Circuits, vol. 42, No. 2, Feb. 2007, pp. 247-257.
Naveen Verma and Anantha Chandrakasan, "An Ultra Low Energy 12-bit Rate-Resolution Scalable SAR ADC for Wireless Sensor Nodes", IEEE Journal of Solid-State Circuits, vol. 42, No. 6, Jun. 2007, pp. 1196-1205.
International Search Report dated Jun. 7, 2010, in counterpart international application No. PCT/US2009/065697.

* cited by examiner

*Primary Examiner*—Lam T Mai
(74) *Attorney, Agent, or Firm*—Kenyon & Kenyon LLP (57) ABSTRACT

An SAR analog-to-digital converter performs bit decisions in each of a plurality of clock cycles. A sense circuit monitors signals input to a latch within a comparator of the ADC and, when the signals are sufficient to establish a bit decision, the sense circuit terminates a currently active clock cycle causes a bit decision to occur in advance of a normal expiration of the clock cycle. If the signals are insufficient to establish a bit decision prior to a default expiration time of the clock cycle, the clock cycle concludes at the default expiration time.

16 Claims, 8 Drawing Sheets

SELF-TIMED CLOCKED ANALOG TO DIGITAL CONVERTER

BACKGROUND

Analog to digital converters (ADC), as their name implies, generate multi-bit digital values from analog signals. ADCs are used throughout modern electronic systems, often to convert the outputs of sensors and transducers to digital form for further processing by computer systems.

There are several types of ADCs. One known architecture, called the successive approximation register analog-to-digital converter (SAR ADC) samples an input voltage and compares it to a plurality of threshold voltages on a bit by bit basis. When converting an analog voltage to a 14-bit digital codeword, an SAR ADC will perform 14 decisions, one decision for each bit in the codeword. To this end, the SAR ADC often includes one or more capacitor arrays to store sampled voltages and to generate reference voltages and a comparator to compare the sampled voltage to each reference voltage and perform bit decisions.

In traditional, high-resolution SAR ADCs, it is often the performance of the comparator that limits the maximum conversion rate of the ADC. The performance of the comparator is usually defined by a worst case resolution time, representing a time required to resolve a minimum differential voltage at the comparator's inputs. Ordinary SAR ADCs clock their comparators at a constant clock rate commensurate with this worst-case performance. However, by definition, this minimum error only occurs during one bit-trial of a multi-bit conversion process. During all other bit trials, the errors at the comparator inputs are larger, so the comparator often settles at a decision faster than the worst-case performance. Since ordinary SAR ADCs clock their comparators at a constant clock rate representing the worst-case settling characteristics, the SAR ADCs operate inefficiently.

Accordingly, the inventors perceive a need in the art for an ADC that provides increased processing capability as compared to ADCs clocked under the worst case scenario. The inventors perceive a need in the art for an ADC that performs bit decisions as fast as the ADC's comparator is capable of making them.

DETAILED DESCRIPTION

Embodiments of the present invention provide an analog-to-digital converter that performs a bit decision in each of a plurality of clock cycles. A sense circuit monitors signals input to a latch within a comparator of the ADC and, when the signals are sufficient to establish a bit decision, the sense circuit terminates a currently active clock cycle that causes a bit decision to occur in advance of a normal expiration of the clock cycle. If the signals are insufficient to establish a bit decision prior to a default expiration time of the clock cycle, the clock cycle concludes at the default expiration time.

Figure 1:
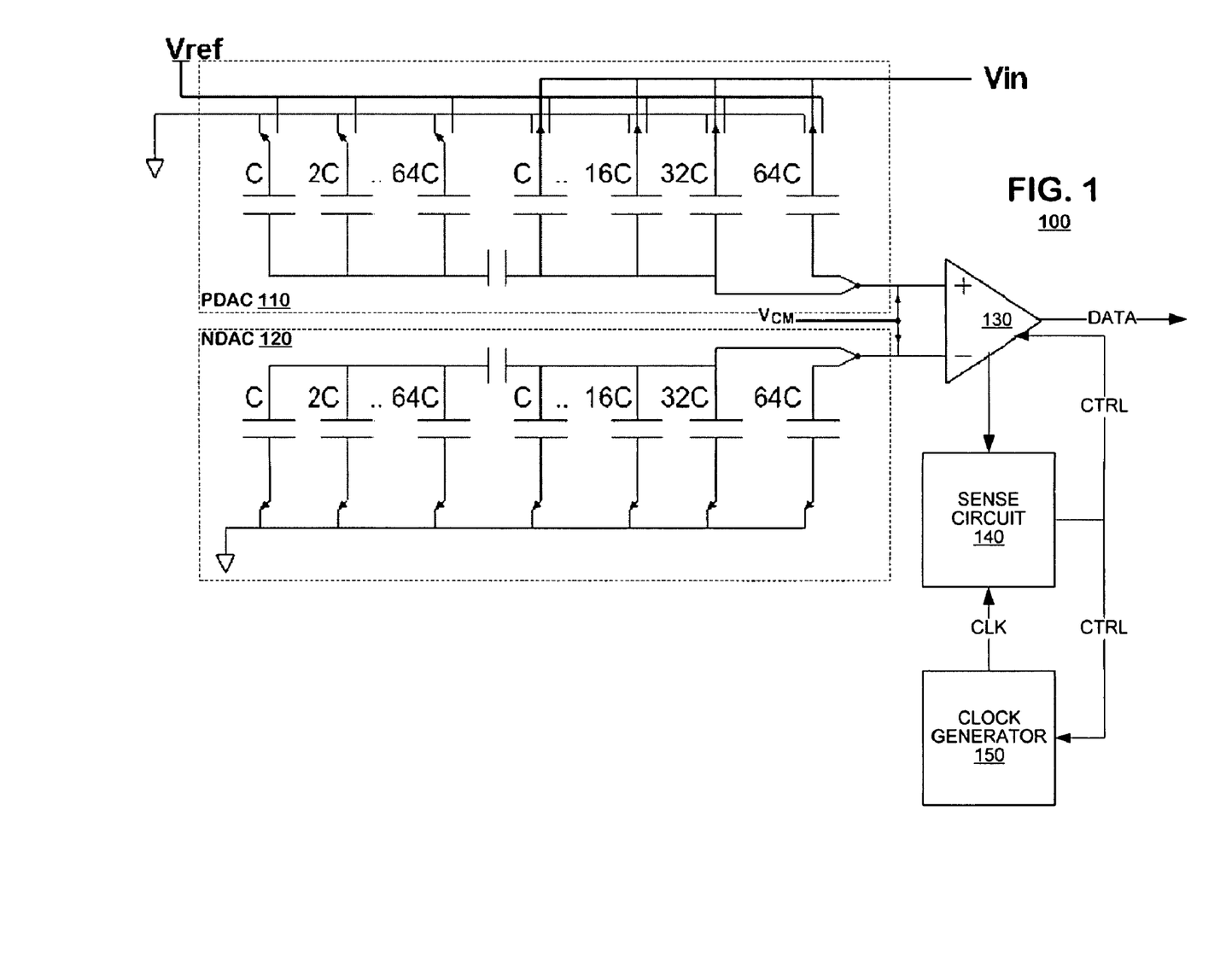
FIG. 1 is a circuit diagram of an analog-to-digital converter according to an embodiment of the present invention.

FIG. 1 illustrates an SAR ADC according to an embodiment of the present invention. The ADC may include a pair of capacitor arrays PDAC 110, NDAC 120 that are connected to a comparator 130. A first capacitor array 110 samples an input voltage $V_{IN}$ and tests the input voltage against threshold voltages to establish a digital word on a bit-by-bit basis. In a first test cycle, the SAR ADC tests the sampled input voltage against a value corresponding to the most significant bit position (MSB). In a second cycle, having established the MSB bit, the SAR ADC tests the sampled voltage against a value corresponding to the next most significant bit position. The SAR ADC iteratively tests voltages corresponding the remaining bit positions in the ADC until it develops a complete digital word corresponding to the sampled input voltage. In this regard, the operation of SAR ADCs is well known.

Embodiments of the present invention provide a differential amplifier that operates according to dynamic clock cycles. The comparator 130 may include a sense circuit (shown as 140) that determines when the comparator 130 has completed a bit decision. When the comparator 130 completes its bit decision, it may generate a CTRL signal that truncates a current bit decision and resets a clock generator 150 for a next clock cycle. In practice, relatively few bit decisions will require significant time to be resolved (usually 3-4 bit decisions in a 10 bit word). The remaining bit decisions can be resolved in a relatively short period of time. By shortening clock cycles for those bit decisions that can be resolved quickly, the comparator 130 shortens the aggregate conversion process.

Figure 2:
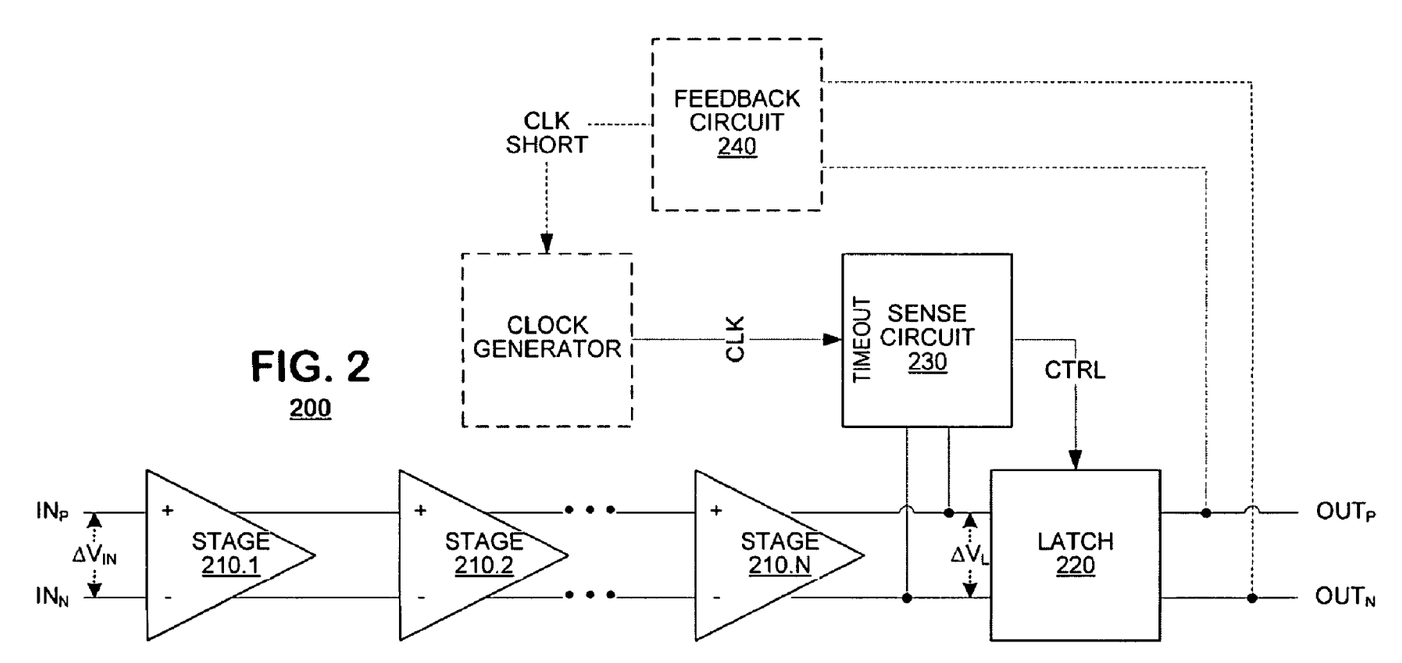
FIG. 2 is a diagram of a comparator and dock generator according to an embodiment of the present invention.

FIG. 2 is a block diagram of a comparator 200 according to an embodiment of the present invention. In a SAR ADC (FIG. 1), a differential amplifier may include one or more amplifier stages 210.1-210.N in cascade and a latch 220. A first amplifier stage 210.1 receives a differential voltage $\Delta V_{IN}$ at its inputs and generates an amplified differential voltage signal on a pair of outputs. Any intermediate stages 210.2, etc. may receive an amplified differential signal from a preceding stage at its inputs, further amplifies the input signal and deliver an output signal to a succeeding stage. A final stage 210.N receives a differential signal at its inputs, further amplifies the differential signal and delivers a differential output signal $\Delta V_L$ to the latch 220. The latch 220 may be controlled by a control signal CTRL. In response to an edge of the control signal CTRL, the latch 220 may generate a differential output signal ($OUT_P$, $OUT_N$) based on the voltages present at its input. The binary output signal represents the decision of the comparator 200.

The comparator 200 may include a sense circuit 230 having a pair of inputs coupled to the input terminals of the latch 220 and a third input coupled to a clock generator. The sense circuit 230 may detect when voltages output by the final amplifier stage 210.N reach a threshold sufficient to cause the latch 220 to generate a binary decision. If the voltages reach the threshold level, the sense circuit 230 may trigger the CTRL signal, which is output to the latch 220. In response, the latch 220 may renders a bit decision.

It may occur that the voltages present at the input of the latch 220 do not reach a threshold within a given clock cycle. In such a case, if the clock cycle concludes before the threshold voltage is reached, the sense circuit 230 may assert the control signal CTRL and cause the latch 220 to render a bit decision at the conclusion of the clock cycle. The clock signal CLK, when applied to the sense circuit 230, may be considered a timeout signal.

The sense circuit 230 may assert the CTRL signal when either the threshold voltage difference is presented at the latch input or when the CLK signal causes a timeout. During conversion operations, the majority of bit decisions will cause large, fast voltage deviations at the latch input. The sense circuit 230, therefore, will truncate a high percentage of bit decisions, which improves processing time of the entirety of the conversion process.

In an embodiment, the comparator 200 also may include a feedback circuit 240 to determine when the latch 220 has made a bit decision and truncate operation of a currently-active clock cycle at a clock generator. In the embodiment shown in FIG. 2, the feedback circuit 240 may be coupled to output terminals of the latch 220. The feedback circuit 240 may be another sense circuit to determine when output voltages from the latch represent a completed bit decision.

Figure 3:
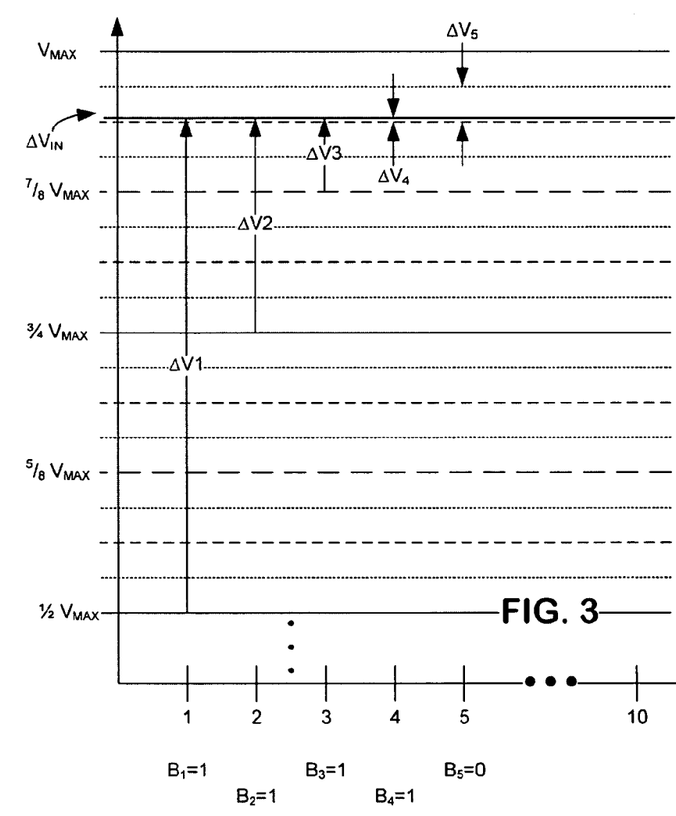
FIG. 3 is a graph of an exemplary waveform illustrating operation of an embodiment of the present invention.
Figure 4:
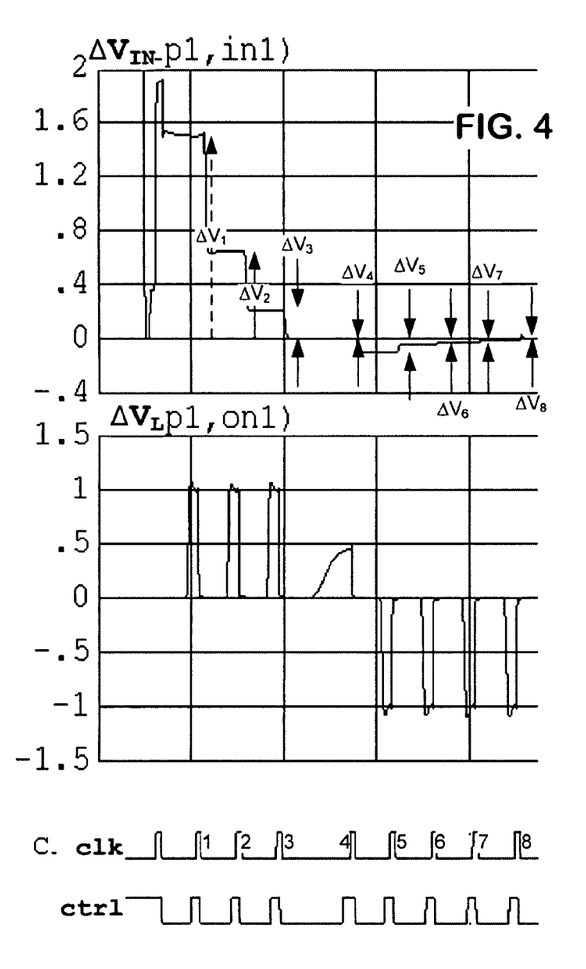
FIG. 4 is a graph of another exemplary waveform illustrating operation of an embodiment of the present invention.

FIGS. 3 and 4 illustrate exemplary waveforms that may be created during operation of the ADC of FIG. 1. FIG. 3 is a graph illustrating an exemplary bit-by-bit comparison of a sampled input voltage ($\Delta V_{IN}$) against various threshold voltages $\Delta V_i$. The ADC can resolve an input voltage having a magnitude from zero to $V_{MAX}$ volts, although the graph of FIG. 3 shows only voltages between $\frac{1}{2} V_{MAX}$ and $V_{MAX}$. In this example, the sampled voltage $\Delta V_{IN}$, is approximately equal to $\frac{15}{16} V_{MAX}$. Thus, the $\Delta V$ input voltage at clock cycle 4 ($\Delta V_4$) will be extremely small as compared to the $\Delta V$ input voltage at clock cycles 1-3 and 5-8, for example.

FIG. 4 illustrates a simulation of the input voltages of FIG. 3 (the $\Delta V_{IN}$ graph) and response of the amplifier chain of FIG. 2, which generates input voltages to the latch (the $\Delta V_L$ graph). As illustrated in FIG. 4, the input signals to the latch respond very quickly and very sharply when performing comparisons at clock cycles 1-3 as compared to the input signals provided at clock cycle 4. Similarly, the input signals to the latch resume quick and sharp responses at clock cycle 5.

FIG. 4 also illustrates timing of the clock signal CLK and the CTRL signal. As shown in FIG. 4, the CTRL signal is asserted during clock cycles 1-3 in response to the voltages input to the latch which truncates operation of those clock cycles. The CTRL signal also is shown as being asserted during clock cycle 4 but after a longer evaluation period than clock cycles 1-3 due to the shorter rise time present in graph $\Delta V_L$. Thereafter, for clock cycle 5 and the succeeding clock cycles, the input voltages to the latch exhibit faster rise times which lead to faster assertions of the CTRL signal.

Figure 5:
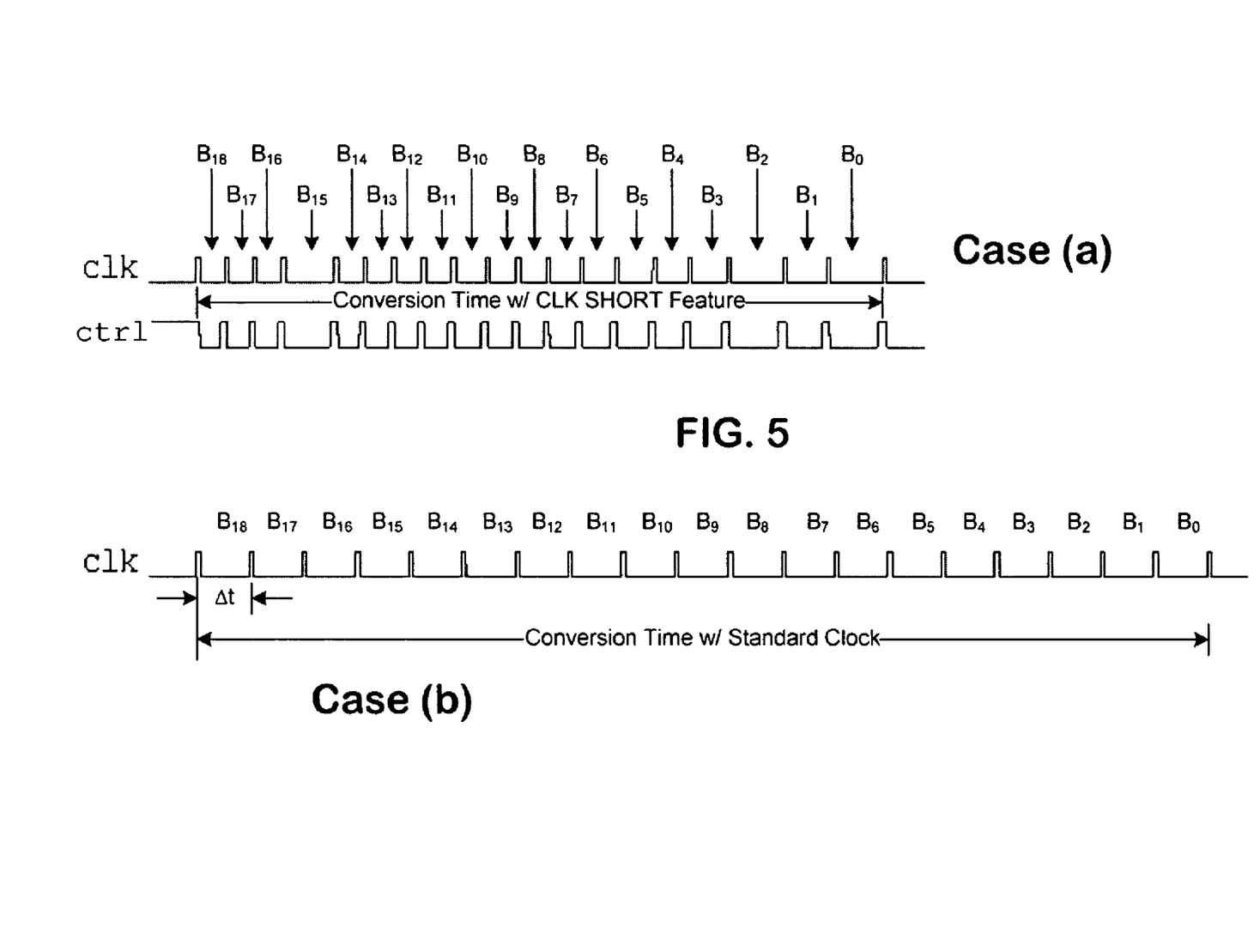
FIG. 5 is a timing diagram illustrating operation of an embodiment of the present invention.

FIG. 5 contains simulation graphs comparing operation of the comparator of FIG. 2 (case a) and a conventional comparator, which operates according to a standard clock of fixed timing (case b). In case b, the comparator is simulated as being driving by a standard, fixed duty cycle clock at period T. In case a, the comparator also is simulated as driven by a clock of period T but in which individual clock cycles can be shorted by assertion of the CTRL signal. As illustrated, the conversion time of case a is substantially shorter than the conversion time of case b, which provides increased throughput by the ADC.

FIG. 5 also illustrates general behavior of the CTRL signal. Generally, testing of the least significant bits (typically the three LSBs of the converter) involves small voltage differences and, therefore, the CTRL signal may not be asserted for all such cycles. For the remaining bit positions, there generally will be at most one other bit position for which the CTRL signal is delayed. In the examples of FIGS. 3-5, this has been illustrated as occurring in the fourth clock cycle of testing.

As noted, the timing of the CTRL signal occurs dynamically in response to the differential voltage $\Delta VL$ that is input to the latch. Accordingly, the timing of the assertion of the CTRL signal likely will vary from clock cycle to clock cycle. Although the timing of the CTRL signal may appear to be uniform through cycles 1-3 and 5-10, for example, it is not the case in simulation and need not be the case in all use cases.

Figure 6:
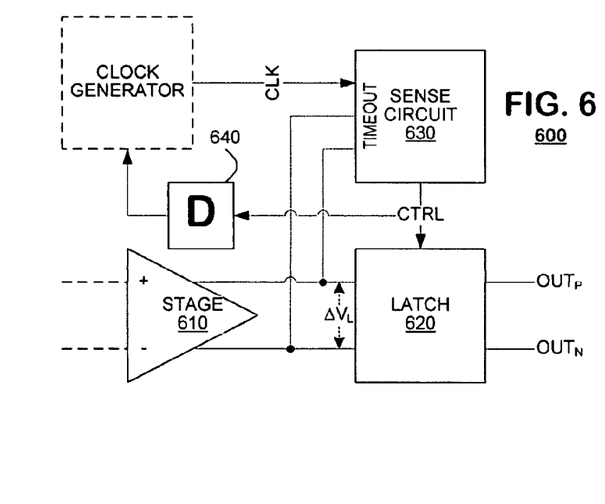
FIG. 6 is a diagram of a latch and a sense circuit according to another embodiment of the present invention.

FIG. 6 is a block diagram of a comparator 600 according to another embodiment of the present invention. The comparator 600 may include one or more amplifier stages 610 and a latch 620. Only one amplifier stage is shown in the example of FIG. 6. The latch 620 may be controlled by a control signal CTRL from a sense circuit 630, which may be asserted when the differential voltage $\Delta V_L$ is sufficient for the latch 620 to render a bit decision or when the CLK signal generates a timeout condition in the sense circuit 620. In response to an edge of the control signal CTRL, the latch 620 may generate a differential output signal ($OUT_P$, $OUT_N$) based on the voltages present at its input. The binary output signal represents the decision of the comparator 600. In this regard, the comparator 600 of this embodiment operates similarly to the FIG. 2 embodiment.

The embodiment of FIG. 6 may generate a feedback signal to a clock generator directly from the control signal CTRL. In this embodiment, the control signal CTRL may be input both to the latch 620 and to a delay element 640. An output from the delay element 640 may be fed back to the clock generator. In response to assertion of the CTRL signal that precedes the normal termination of a current clock cycle, the clock generator may terminate the clock cycle and advance to a next clock cycle.

Figure 7:
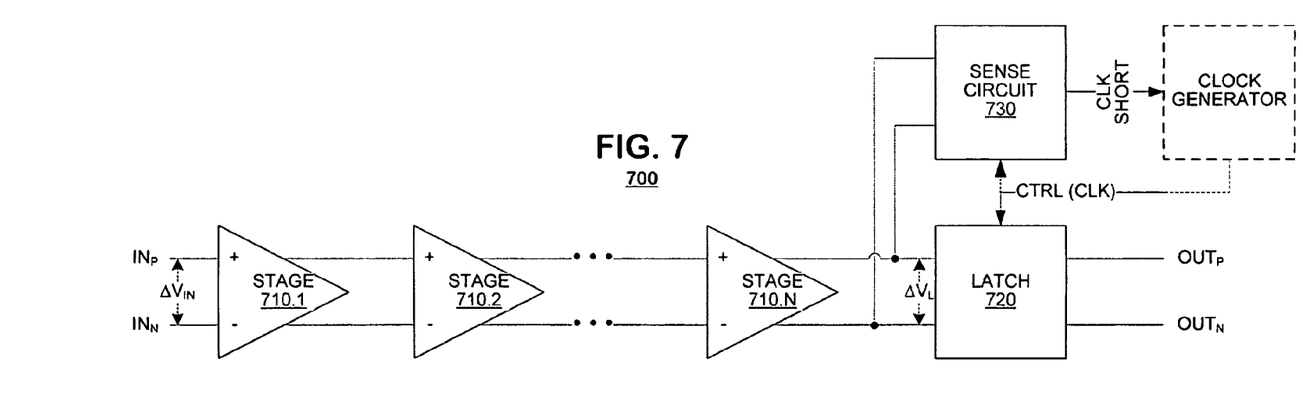
FIG. 7 is a diagram of a comparator and clock generator according to another embodiment of the present invention.

FIG. 7 is a block diagram of a comparator 700 according to an embodiment of the present invention. The comparator 700 may include one or more amplifier stages 710.1-710.N provided in cascade and a latch 720. A first amplifier stage 710.1 receives a differential voltage $\Delta V$ at its inputs and generates an amplified differential voltage signal on a pair of outputs. Intermediate stages 710.2, etc. respectively receive an amplified differential signal from a preceding stage at their inputs, further amplify the input signal and deliver an output signal to a succeeding stage. A final stage 710.N receives a differential signal at its inputs, further amplifies the differential signal and delivers a differential output signal to the latch 720. The latch 720 may be driven by a clock signal CLK. In response to an edge of the clock signal, the latch 720 may generate a differential output signal ($OUT_P$, $OUT_N$) based on the voltages present at its input. The binary output signal represents the decision of the comparator 700.

The comparator 700 may include a sense circuit 730 to dynamically adjust a clock signal CLK provided to the latch. Inputs of the sense circuit 730 may be coupled to inputs of the latch 720. The sense circuit 730 may detect when voltages output by the final amplifier stage 710.N are sufficient to cause the latch 720 to generate a binary decision. When the voltages reach a sufficient level, the sense circuit 730 may generate a CLK SHORT signal, which is output to a clock generator. In response, the clock generator may truncate a currently active clock cycle CLK. When the clock cycle is terminated, the latch 720 may render a bit decision.

In the absence of a CLK SHORT assertion by the sense circuit 730, the clock generator may operate according to a default oscillation. In practice some bit decisions may generate differential voltages to the latch that are so small, it is appropriate to include the full processing time of the amplification stages 710.1-710.N. In such cases, the sense circuit 730 may not assert the CLK SHORT signal and the clock cycle concludes according to the default oscillation of the clock generator.

Figure 8:
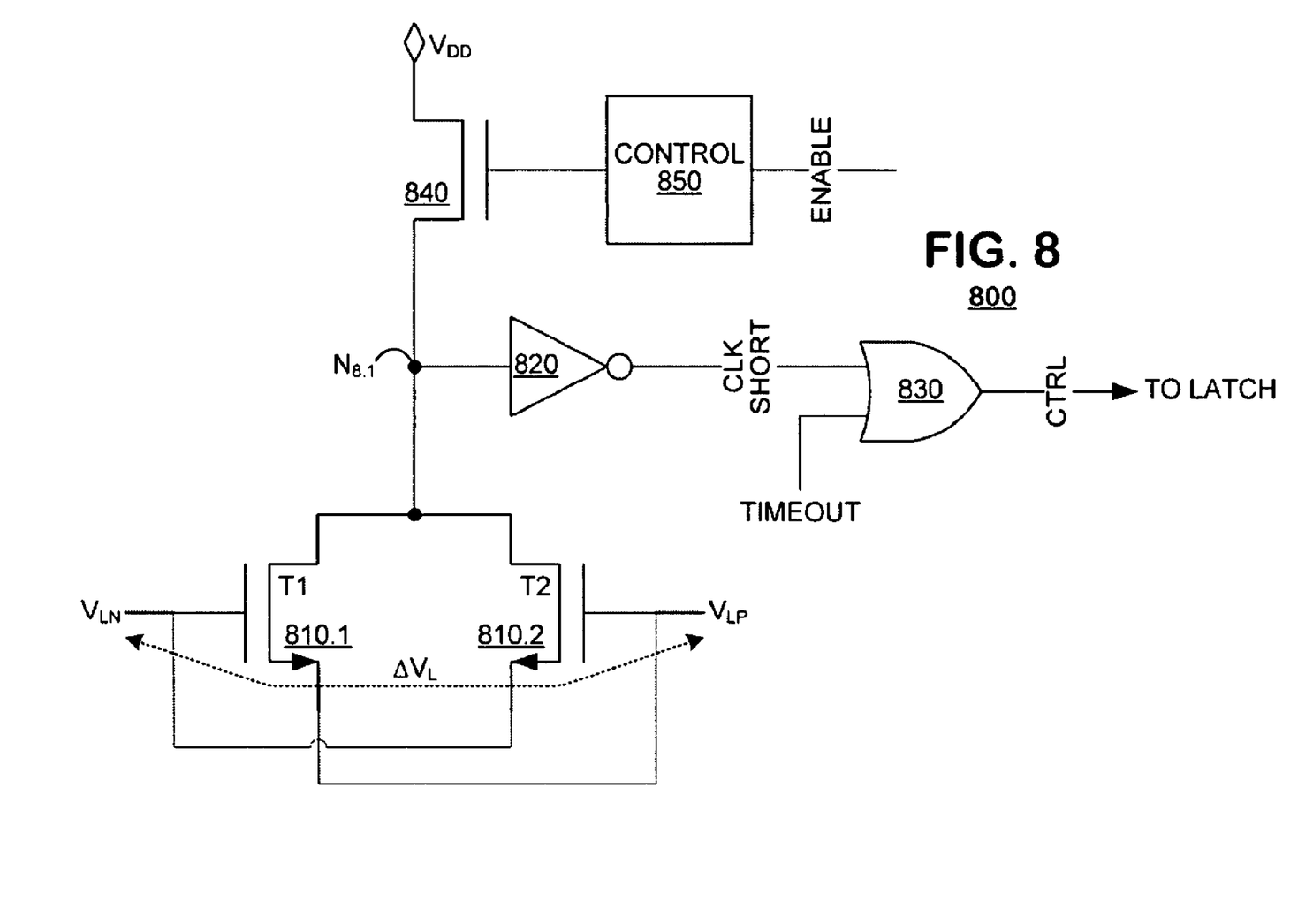
FIG. 8 is a diagram of a sense circuit according to an embodiment of the present invention.

FIG. 8 is a diagram of a sense circuit 800 according to an embodiment of the present invention. The sense circuit may include a pair of pull down transistors 810.1, 810.2 having gates coupled respectively to input terminals of the circuit (labeled $V_{LP}$ and $V_{LN}$). The sense circuit further may include an inverter buffer 820 and an OR gate 830, which generates the control signal CTRL that is output to the latch. The sense circuit 800 further may include an activation transistor 840 and a control unit 850 which may disable the sense circuit 800 in response to an externally-supplied ENABLE signal.

During operation, a differential voltage $\Delta V_L$ may be presented across the input terminals $V_{LP}$, $V_{LN}$. If either of the voltages $V_{LP}$, $V_{LN}$ reach a level sufficient to cause their corresponding transistor to conduct, the voltage at node $N_{8.1}$ drops. The output of the inverter 820 may generate a voltage at or near $V_{DD}$, which is input to the OR gate. The OR gate may assert the control signal CTRL in response to the rising output of the inverter 820 or in response to the TIMEOUT signal (the natural termination of the active clock cycle).

At shown, the $V_{LP}$, $V_{LN}$ inputs may be coupled to gates of the pull down transistors 810.1, 810.2. They also may be coupled to emitters of the counterpart transistors (e.g., $V_{LP}$ is shown coupled to the gate of transistor 810.2 and to the emitter of transistor 810.1). Because the input signals are differential signals, when one input voltage increases above ground (say $V_{LP}$), the counterpart input voltage $V_{LN}$ decreases below ground. Thus, the connectivity shown in FIG. 8 provides for fast operation in the sense circuit 800. Alternatively, the emitters of transistors 810.1, 810.2 may be connected to an intermediate common mode voltage.

Figure 9:
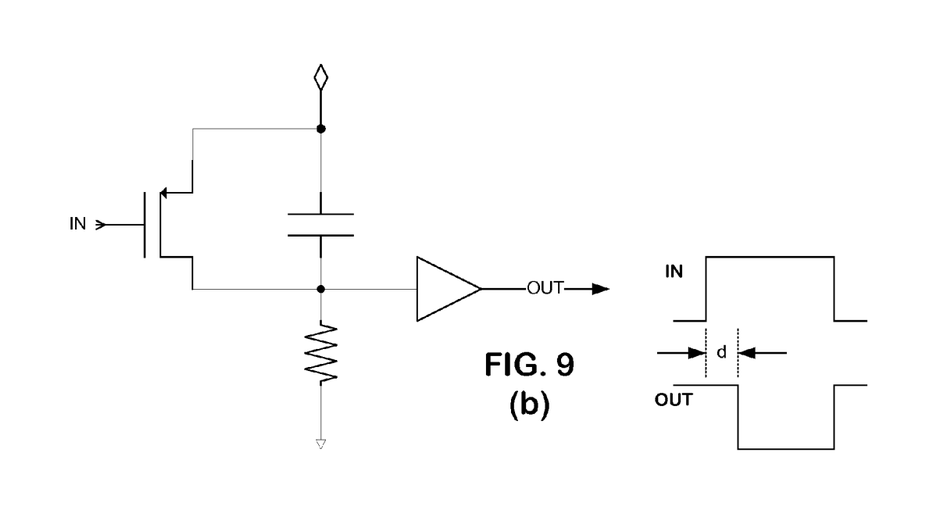
FIG. 9 is a diagram of a clock generator according to an embodiment of the present invention.
Figure 9A:
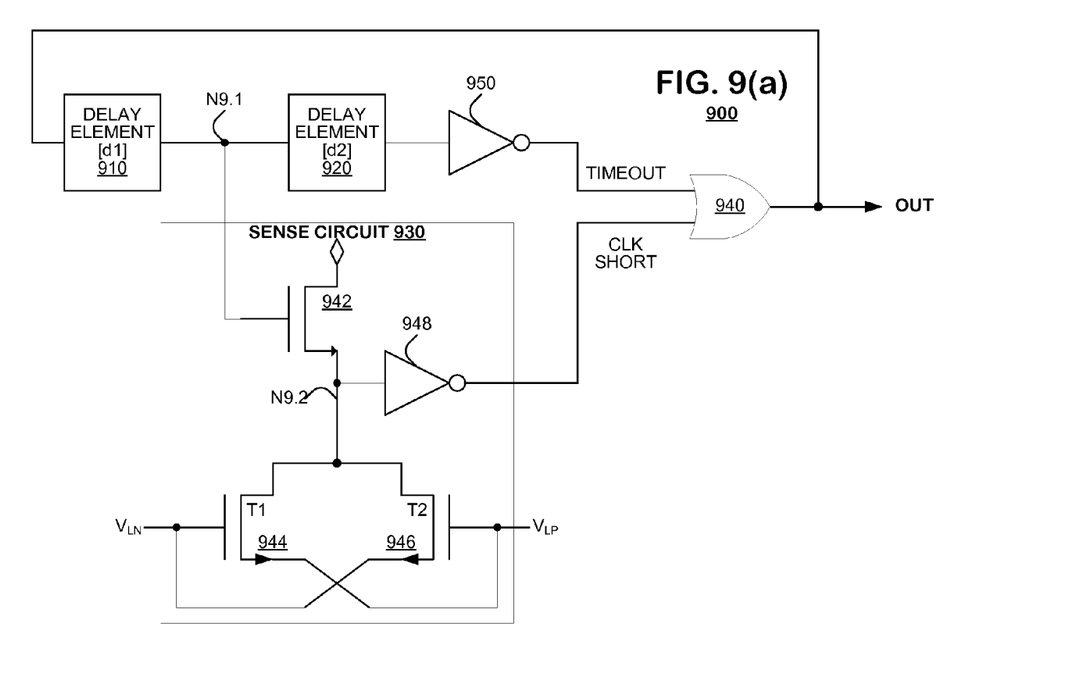

FIG. 9(a) illustrates a clock generator 900 according to an embodiment of the present invention. The clock generator 900 may include an array of delay elements 910-920, a sense circuit 930 and an OR gate 940 provided in a loop. Each of the delay elements 910-920 may impose a respective delay on an input signal. The delay elements 910, 920 may be edge sensitive delay elements, meaning they may impose delay on a rising edge of an input signal but not a falling edge of the input signal. The structure and response of the delay elements may be provided as in FIG. 9(b). The output of the second delay element 920 may be coupled to a first input of the OR gate 940 via an inverter 950.

The sense circuit 930 and OR gate 940 may be provided as in FIG. 8. The sense amplifier 930 may include a pull up transistor 942 having an input coupled to node N9.1, the output of the first delay element 910. The sense circuit 930 may include a pair of pull down transistors 944, 946 having input terminals coupled to the input terminals of a the comparator latch (not shown). An intermediate node N9.2 may be coupled to a second input of the OR gate 940 via an inverter 948.

Graphs 9(c) and 9(d) illustrate operation of the clock generator 900 in two different modes. Generally, the clock generator 900 will oscillate at a clock speed determined by the delay of the first delay element 910 (d1) and the shorter of a) the delay of the second delay element 920 (d2) and the response of the sense circuit 930 (shown as d3 in FIGS. 9(c) and (d)). The response of the sense circuit 930 changes dynamically due to operating conditions of the comparator and, therefore, the response of the clock generator may vary in kind.

Graph 9(c) illustrates a mode of operation that may occur when the sense circuit 930 asserts the CTRL signal before the second delay element 920. The first delay element 910 delays and inverts a rising edge of an output clock, which is output to the second delay element 920 and the sense circuit 930 simultaneously. After the d3 period, the sense circuit 930 asserts the CTRL signal, which causes the then-current clock cycle to terminate. The second delay element 920 asserts the TIMEOUT signal at a period d2 but it has no effect on the output clock signal due to the earlier assertion of the CTRL signal.

Graph 9(d) illustrates operation that may occur when the sense circuit 930 does not assert the CTRL signal before the second delay element 920 asserts the TIMEOUT signal. Again, the first delay element 910 delays and inverts a rising edge of an output clock, which is output to the second delay element 920 and the sense circuit 930 simultaneously. After the d2 period, the second delay element 920 asserts the TIMEOUT signal to the OR gate, which causes the then-current clock cycle to terminate. The sense circuit 930 may assert the CTRL signal sometime thereafter but it has no effect on the output clock due to the earlier assertion of the TIMEOUT signal.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A comparator comprising:
    at least one input amplifier,
    a latch having inputs coupled to outputs of the amplifier, the latch to render a bit decision in response to a control signal,
    a sense circuit coupled to the latch inputs to determine when voltages present on the latch inputs are sufficient to cause the latch to generate a bit decision; and
    means to assert the control signal according to the earlier of a determination from the sense circuit or a default clock signal.

2. The comparator of claim 1, wherein the sense circuit is clocked by the default clock signal and the means comprises a direction connection between a sense circuit output and a control input of the latch.

3. The comparator of claim 1, wherein the means comprises a clock generator having an input coupled to an output of the sense circuit, the clock generator operating in a short cycle mode and a long cycle mode as determined by the output of the sense circuit, an output of the clock generator generating the control signal to the latch.

4. The comparator of claim 1, wherein the sense circuit comprises:
    a pair of transistors each having an input for a respective input of the latch and coupled to a common node, and
    a logic circuit coupled to the common node to generate the control signal in response to a voltage transition at the common node created by one of the transistors.

5. The comparator of claim 1, wherein the comparator comprises a cascaded series of amplifiers.

6. The comparator of claim 1, provided in an successive approximation register analog to digital converter.

7. A method for converting an analog voltage to a digital codeword, comprising, on each of a plurality of clock cycles:
    amplifying a differential voltage representing a comparison between an input voltage and a respective reference voltage, the amplifying characterized by a delay that depends upon a magnitude of the differential voltage, sensing when the amplified voltage is sufficient to render a bit decision, and when the amplified voltage is sufficient to render a bit decision:
- latching the amplified voltage representing a bit decision, and
- terminating a current clock cycle to advance an onset of a next clock cycle.

8. A comparator comprising:
- at least one input amplifier,
- a latch having inputs coupled to outputs of the amplifier, the latch to render a bit decision in response to a control signal,
- a sense circuit coupled to the latch inputs and having an input for a clock signal, the sense to generate the control signal at the earlier of:
  - a time at which voltages present on the latch inputs are sufficient to cause the latch to generate a bit decision or
  - upon expiration of the clock signal.

9. The comparator of claim 8, wherein the sense circuit comprises:
- a pair of transistors each having an input for a respective input of the latch and coupled to a common node, and
- a logic circuit coupled to the common node to generate the control signal in response to a voltage transition at the common node created by one of the transistors.

10. The comparator of claim 8, wherein the comparator comprises a cascaded series of amplifiers.

11. The comparator of claim 8, provided in a successive approximation register analog to digital converter.

12. An electronic circuit, comprising:
- a clocked comparator having inputs for a differential voltage and to generate a binary comparison signal in response thereto, the clocked comparator comprising an output latch;
- a sense circuit coupled to inputs of the output latch to assert a clock short signal when the binary comparison is ready, and
- a clock generator to generate a clock signal to the comparator, each cycle of the clock signal expiring on the earlier of default clock period or in response to the clock short signal from the sense circuit.

13. The circuit of claim 12, wherein the comparator performs amplification characterized by a delay that depends upon a magnitude of the differential voltage.

14. The circuit of claim 12, wherein the comparator comprises a cascaded series of amplifiers, an output of a final amplifier coupled to the latch.

15. The circuit of claim 12, wherein the latch comprises:
- cascaded first and second inverter buffers, and
- a feedback inverter buffer coupled to an input and output of the second inverter buffer.

16. The circuit of claim 12, wherein the sense circuit comprises:
- a pair of transistors each having an input for a respective input of the latch and coupled to a common node, and
- a logic circuit coupled to the common node to generate the control signal in response to a voltage transition at the common node created by one of the transistors.

* * * * *